United States Patent [19]

Barron et al.

[11] 3,790,825

[45] Feb. 5, 1974

[54] GATE-DIFFUSION ISOLATION FOR JFET DEPLETION-MODE BUCKET BRIGADE CIRCUIT

[75] Inventors: Mark B. Barron; Walter J. Butler, both of Scotia, N.Y.

[73] Assignee: General Electric Company, Schenectady, N.Y.

[22] Filed: Oct. 10, 1972

[21] Appl. No.: 295,872

[52] U.S. Cl. .......... 307/304, 307/221 D, 307/303, 317/235 A, 317/235 E, 317/235 G

[51] Int. Cl. .......... H01l 19/00

[58] Field of Search .... 307/304; 317/235 A, 235 G, 317/235 E

[56] References Cited

UNITED STATES PATENTS

| | | | |
|---|---|---|---|
| 3,335,342 | 8/1967 | Leistiko et al. | 317/235 A |
| 3,293,087 | 12/1966 | Porter | 317/235 A |
| 3,653,988 | 4/1972 | Glinski et al. | 317/235 A |

FOREIGN PATENTS OR APPLICATIONS

| | | | |
|---|---|---|---|
| 6,805,705 | 10/1969 | Netherlands | 317/235 G |
| 1,208,266 | 10/1970 | England | 317/235 G |

*Primary Examiner*—Rudolph V. Rolinec
*Assistant Examiner*—William D. Larkins
*Attorney, Agent, or Firm*—Louis A. Moucha; Joseph T. Cohen; Jerome C. Squillaro

[57] ABSTRACT

Undesired coupling of JFET bucket-brigade stages through the epitaxial layer in a monolithic integrated bucket-brigade circuit is prevented by isolation diffusion regions formed in the epitaxial layer along the two sides of a row of bucket-brigade stages. The isolation diffusion regions are slightly spaced from the JFET gate diffused regions and are reverse-biased so that depletion regions extend down to the substrate. The close spacing of the gate and isolation diffusion regions results in the gate and isolation depletion regions joining upon application of voltage to the gate to pinch off the transistor. The storage capacitors of the bucket-brigade stages are MOS devices formed by metal layers overlapping the JFET drain electrode regions diffused in the epitaxial layer with the capacitor dielectric being a dielectric layer therebetween.

12 Claims, 4 Drawing Figures

GATE-DIFFUSION ISOLATION FOR JFET DEPLETION-MODE BUCKET BRIGADE CIRCUIT

Figure 2C:
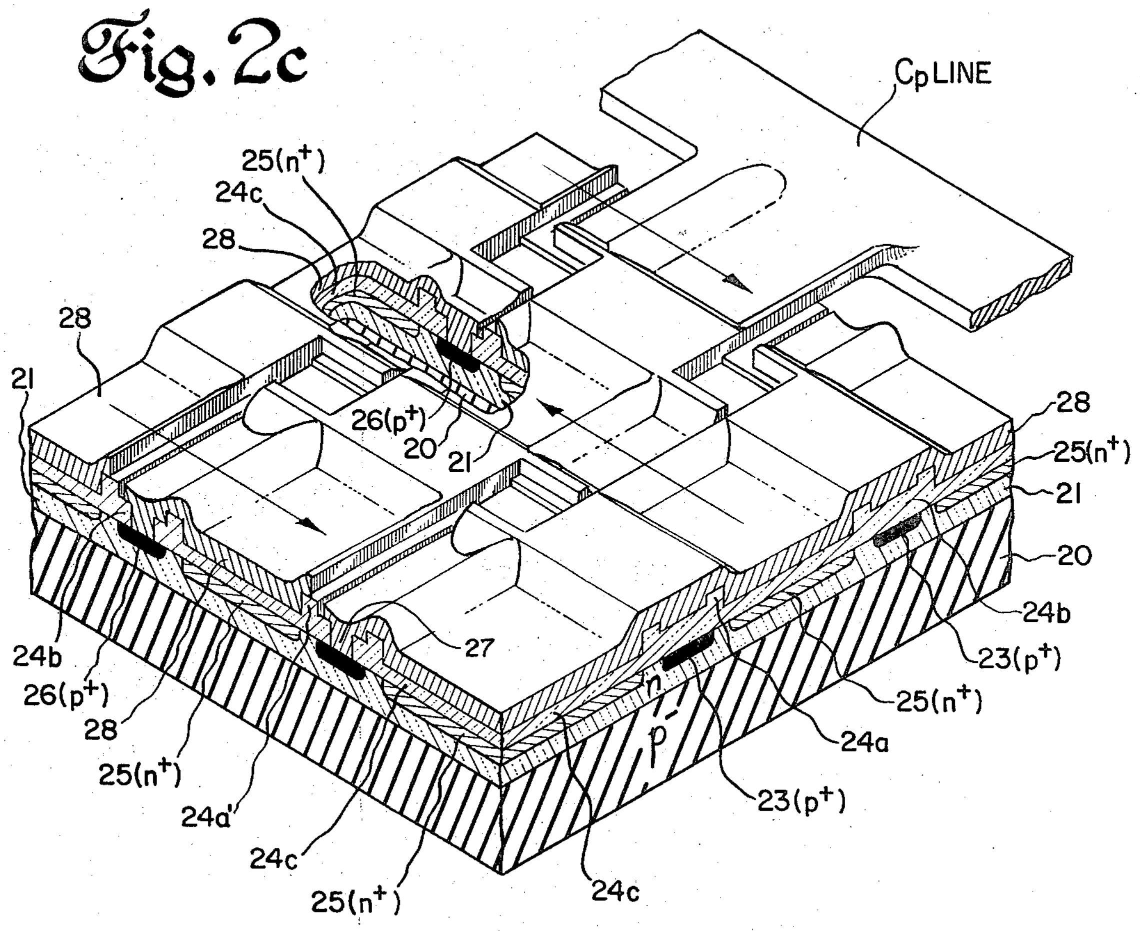

Our invention relates to a monolithic integrated analog circuit of the bucket-brigade type, and in particular, to a means for preventing undesired coupling of bucket-brigade stages in the circuit. The invention herein described was made in the course of or under a contract or subcontract thereunder with the Department of the Air Force.

A concurrently filed application Ser. No. 295,835 entitled "Dielectric Strip Isolation for JET or MESFET Depletion-Mode Bucket-Brigade Circuit," inventors Bruno Kurz, Mark B. Barron and Walter J. Butler, and assigned to the assignee of the present invention, is directed to a related invention wherein strips of dielectric material are used for isolating the bucket-brigade stages.

The recently developed bucket-brigade circuit is currently finding use in many applications such as audio and video delay, time-error correction, time-scale conversion and filtering as some examples. The bucket-brigade circuit is variously described as a sampled-data circuit or a digitally controlled analog charge transfer circuit, but may be most simply described as an analog signal shift register. The bucket-brigade circuit thus provides a means for realizing an electronically variable delay line which has many uses in analog signal processing. The bucket-brigade circuit, herein abbreviated to BBDL for bucket-brigade delay line, may be generally described as a series array of capacitors interconnected by suitable electronic switches which, when implemented in monolithic form in the prior art, have been transistors of the bipolar or MOSFET type. Information can be stored as charged packets in such array of capacitors and is caused to be propagated through the array at a rate determined by the (clock) rate at which the switches are sequentially opened and closed. The bucket-brigade circuit, therefore, provides a non-inductive means for implementing an analog delay line, the delay period of which is controlled by an external clock, and recent advances in microelectronic technology permit implementation of the BBDL in single monolithic integrated circuit form.

The BBDL in integrated circuit form offers many advantages over a like circuit fabricated of discrete transistor and capacitor devices, the most obvious advantages being the compactness, lower power requirements and greater durability of the integrated circuit. In the case of the prior art MOSFET embodiment of the BBDL, the transistors require relatively large gating voltages and the BBDL is limited in speed (information propagation rate through the BBDL) by the small current flow capability of the MOS transistors. In the case of the prior art bipolar transistor embodiment, the integrated circuit approach requires more complex processing, has a relatively low packing density, and is further handicapped by a relatively high base-current requirement. The above-mentioned disadvantages, which may be tolerable for short length BBDLs, place a limit on the practical length of such circuits. However, these disadvantages may be overcome to a great extent by the use of JFETs (junction field effect transistors) as the electronic switches in the BBDL.

The JFET devices, as used herein, are depletion-mode devices, and therefore require isolation between adjacent such devices when formed on a single substrate to prevent undesired coupling through the epitaxial layer of the charge packets which represent the information caused to be propagated through the BBDL, and a novel isolation approach is thus required if reasonable packing densities are to be obtained. Depletion-mode JFET devices are preferred in the BBDL circuit over enhancement-mode devices since lower gating voltages of the order of 5 volts or less are used with depletion mode devices, thereby making the circuit compatible with transistor-transistor logic ($T^2L$) circuitry and reducing the power dissipation of the devices which is proportional to the gate voltage squared. Another reason for preferring the depletion-mode over the enhancement-mode devices is that their operation depends on bulk rather than surface properties. These features are of particular significance for large scale arrays of such depletion-mode devices (and a BBDL of even moderate length is a large scale array) where yield and parameter uniformity are of utmost importance. Although the fabrication of JFET devices is now a well established technology, their use in integrated circuits has been limited to circuits having a common gate control line which limitation results from the processing methods employed. In conventional JFET processing of the common gate control line circuits, a deep $p^+$ diffusion isolation technique is employed whereby the $p^+$ isolation region is diffused through to the *p* substrate, but such technique is impractical with separate gate control lines as required in BBDL circuits due to the short-circuiting of the substrate and JFET gates. In such conventional $p^+$ diffusion isolation, the $p^+$ top-gate diffusion region overlaps the $p^+$ isolation diffusion region whereby all of the gates are connected by the isolation diffusion to the *p* substrate. However, in the case of separate gate control line JFET circuits, the required isolation excludes connection of the $p^+$ gate diffusions to the p substrate. An alternative conventional isolation technique utilizes a ring-type structure in which the transistor source is surrounded by an isolation diffusion, and the gate diffusion which surrounds the drain is kept separate from the isolation. However, the ring structure inefficiently uses the silicon area which results in large capacitances, and excess capacitance is detrimental in BBDL circuits in that it degrades both the input dynamic range and analog bandwidth thereof. In addition, there is a large drain-source feedback capacitance which causes signal dispersion in bucket-brigade circuits. Thus, JFET BBDL integrated circuits require a new isolation method that results in small geometry structures without connection of the transistor gates to the substrate.

Therefore, one of the principal objects of our invention is to provide a new integrated BBDL circuit and method of fabrication thereof.

Another object of our invention is to fabricate the monolithic BBDL circuit utilizing JFET devices as the switching elements in the BBDL.

A further object of our invention is to provide the BBDL circuit with improved high frequency performance.

A still further object of our invention is to provide the BBDL circuit with lower gating voltage requirements.

A base-diffusion technique has been used in the prior art for isolation purposes in bipolar integrated circuits, but in the case of JFET integrated circuits, the structure of the JFET and mode of operation are entirely distinct from the bipolar structure, especially in the fact that the depletion layers of the isolation diffusion (which is the subject of our invention) and the gate diffusion must merge to completely pinch off the channel current in our JFET BBDL.

Therefore, a further object of our invention is to provide the JFET devices and storage capacitors in the BBDL integrated circuit with an improved isolation to prevent undesired coupling through the epitaxial layer of the charge packets which are propagated through the BBDL.

Briefly summarized, and in accordance with the objects of our invention, we provide a monolithic integrated BBDL structure utilizing JFET devices as the switching elements and a method of fabrication thereof. The structure consists of a common substrate fabricated of a lightly doped semiconductor of a first conductivity type or an electrically insulating material on which is formed an epitaxial layer of a second conductivity type semiconductor material. A dielectric layer is then formed ove the epitaxial layer and patterned and etched for the subsequent diffusions into the epitaxial layer of the JFET source-drain and gate regions and isolation diffusion regions. The isolation diffusions are done simultaneously with the gate diffusions and are slightly spaced therefrom. The isolation diffusions are formed in regions such that the resultant isolation depletion regions define the two long-dimensioned sides of each row of serially connected bucket-brigade stages to be formed. The isolation diffusion regions are reverse-biased to form depletion regions extending down to the substrate and thereby isolating adjacent rows of the bucket-brigade stages from each other. Application of a clock voltage to the gates of alternate JFETs results in the gate depletion region thereof and the isolation depletion regions merging to thereby pinch off such transistors and electrically isolating the JFET devices and storage capacitors to be formed and thereby preventing any undesired coupling through the epitaxial layer of the charge packets which are caused to propagate through the BBDL. A metal layer is then deposited over the dielectric layer, and the portions of the overlapping metal layer and the drain diffused regions in the epitaxial layer form the "plates" of the bucket-brigade MOS storage capacitors with the dielectric material therebetween being the capacitor dielectric.

Figure 1:
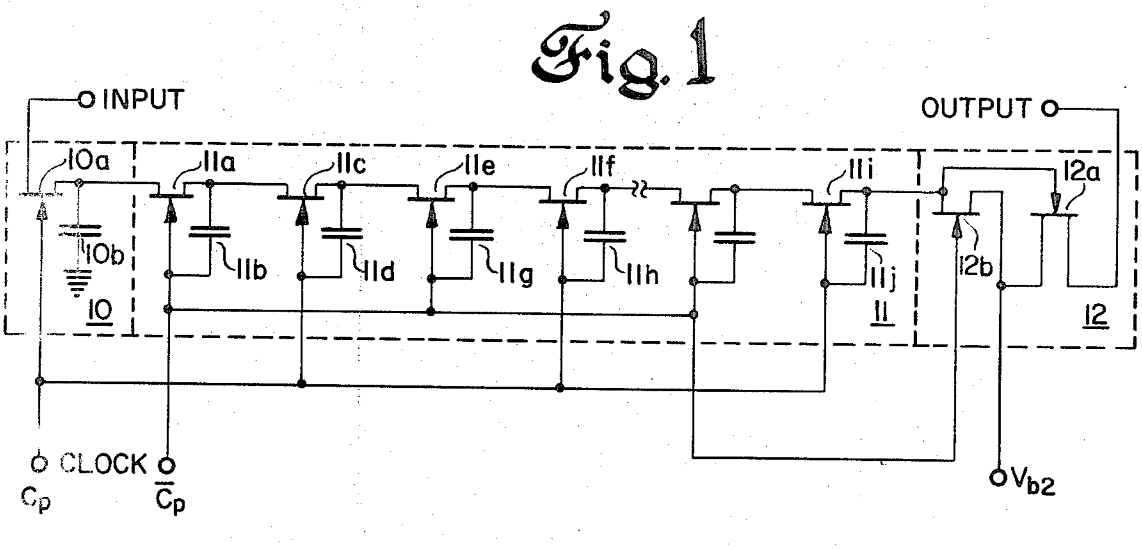
Figure 2A:
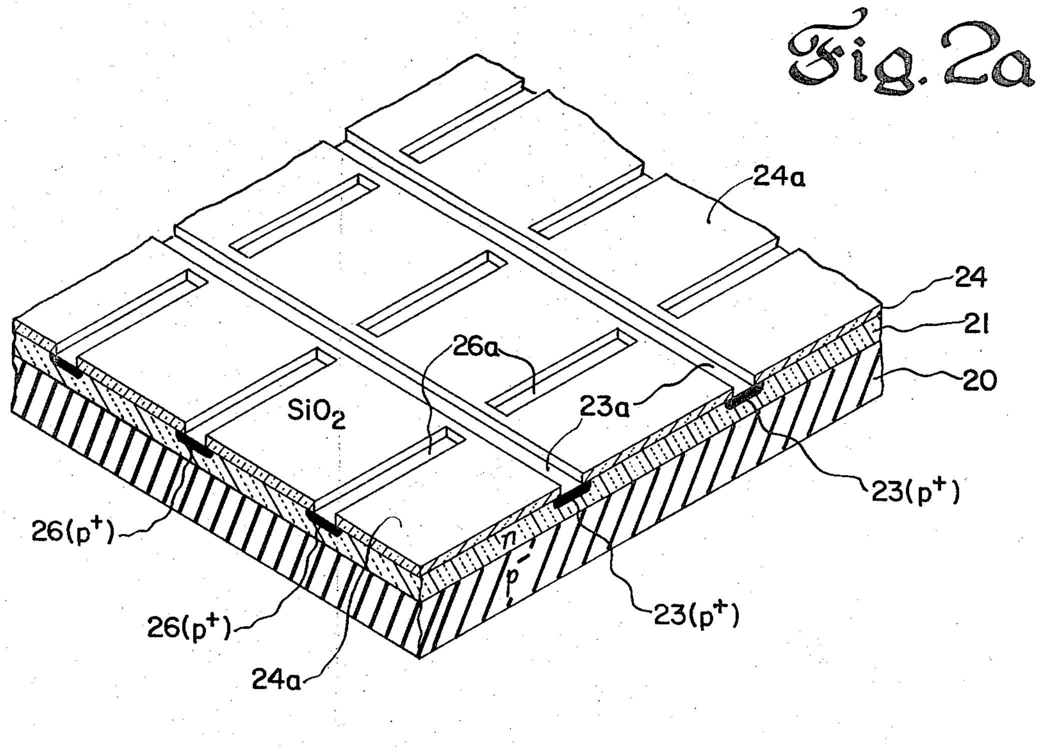

The features of our invention which we desire to protect herein are pointed out with particularity in the appended claims. The invention itself, however, both as to its organization and method of operation, together with further objects and advantages thereof, may best be understood by reference to the following description taken in connection with the accompanying drawings wherein:

FIG. 1 is a schematic representation of a bucket-brigade delay line circuit of the type fabricated in accordance with our invention in integrated circuit form utilizing JFET devices as the switching elements in the BBDL; and FIGS. 2*a* and *b* illustrate intermediate steps in fabricating a JFET bucket brigade utilizing gate diffusion isolation in accordance with our invention and shown in its completed state in FIG. 2*c*.

Referring now in particular to FIG. 1, there is illustrated a typical BBDL which consists of an input sampling stage 10, a plurality of delay line stages 11, and an output stage 12. The BBDL thus samples, holds and delays an input analog signal $x(t)$ by a time T which is normally an integral number of (sampling) intervals $T_s$ at which the input signal is sampled. The input sampling stage 10 of the BBDL consists of a first electronic switch 10*a*, which is a JFET device 10*a* in our particular invention, having its source electrode connected to the input terminal of the BBDL, its gate electrode connected to a line $C_p$ supplied with square wave pulses generated by a two-phase digital clock, and its drain electrode connected to a grounded capacitor 10*b* and to the source electrode of JFET 11*a* in the first stage of the delay line stages 11. The input signal sampling interval $T_s$ is thus controlled by the frequency of clock pulse $C_p$.

Depending upon the type of substrate material utilized in the monolithic fabrication of the BBDL and the potential at which such substrate is maintained, the analog input signal to the BBDL may be biased with a positive or negative voltage. Thus, in the case wherein the substrate is of p-conductivity type material (as exemplified herein) and maintained at ground potential, the analog input signal is biased from a source of positive voltage for insuring that the signal applied to the input $n^+$-region forming the source electrode of input sampling transistor 10*a* is always of positive polarity. The digital clock voltage pulses $C_p$ and $\overline{C}_p$ are of negative polarity for the n-channel type transistors in the BBDL as exemplified herein.

The plurality of delay line stages 11 are formed by serially connected pairs of bucket-brigade stages. Each pair of bucket-brigade stages includes two serially connected electronic switches (JFETs herein) and a charge packet storage capacitor connected across the drain and gate electrodes of each transistor. The gate electrode of the first transistor in each delay line stage is also connected to the complementary clock pulse line $\overline{C}_p$ whereas the gate electrode of the second transistor is also connected to clock pulse line $C_p$. Thus, capcitor 11*b* is connected across the drain and gate electrodes of transistor 11*a*, the gate electrode of transistor 11*a* is also connected to the $\overline{C}_p$ clock pulse line, and the drain electrode is connected to the source electrode of transistor 11*c* which together with capacitor 11*d* forms the second half of the first pair of bucket-brigade stages. Thus, capacitor 11*d* is connected across the drain and gate electrodes of transistor 11*c* and the gate electrode is also connected to the common clock pulse line $C_p$. The drain electrode of transistor switch 11*c* is connected to the source electrode of transistor 11*c* in the following pair of bucket-brigade stages consisting of transistors 11*e*, 11*f* and capacitors 11*g*, 11*h*. The second and all further pairs of bucket-brigade stages are serially connected in the same manner as the first stage. The number of pairs of bucket-brigade stages determines the BBDL time delay, T, for a given clock frequency.

The last bucket-brigade stage of the BBDL consists of transistor 11*i* and capacitor 11*j* connected across its drain and gate electrodes. The gate electrode of transistor 11*i* is also connected to the common $C_p$ clock pulse line, the source electrode is connected to the drain electrode of the previous bucket-brigade stage, and the drain electrode could comprise the output of the BBDL. However, for purposes of isolating the output of the BBDL, an output stage 12 is connected to the drain electrode of transistor 11*i*. The output stage 12 comprises a source-follower stage consisting of a transistor 12*a* having its gate electrode connected to the drain electrode of transistor 11*i*, its drain electrode connected to a source of direct current bias voltage $V_{b2}$ (of positive polarity when input bias is positive) and its source electrode being the output terminal of the BBDL. A transistor 12*b* having its source electrode connected to the drain electrode of transistor 11*i*, its drain electrode connected to the source of bias voltage $V_{b2}$ and its gate electrode connected to the common complementary clock pulse line $\overline{C}_p$ is utilized as a switching device for precharging the last capacitor 11*j* in the BBDL to a full charge, that is, transistor 12*b* permits filling the last "bucket" in accordance with conventional operation of BBDLs wherein the fullness of the buckets (the capacitive storage elements) proceeds from the last stage toward the first stage and the emptiness of such buckets, which contains the information (sampled analog input signal) to be propagated through the BBDL, proceeds from the first to the last stage. Thus, transistor 12*b* functions as a switch for providing (in conjunction with bias voltage $V_{b2}$) full charge of capacitor 11*j* prior to receiving an analog signal sample. The signal information is represented by the extent to which a full bucket is emptied, that is, the signal propagation through the BBDL from the input to the output ends is effected by means of a charge deficit transfer.

In developing a BBDL for operation at high clock frequencies (in excess of 10 MHz) two problems are faced: (1) the transistor devices in the bucket brigade must be switched from one state to the other at a sufficiently high speed, and (2) the charge packet transfer between adjacent storage sites must also occur sufficiently fast. The clock generator capability determines the rate at which the transistor devices can be switched and the problem is therefore of switching the total gate-substrate capacitance through a required gate voltage. The clock generator (i.e., gate driver) requirements will obviously be much less severe, and result in better high frequency operation, if the total gate-substrate capacitance or required gate voltage can be reduced.

The rate at which charge can be transferred between adjacent storage sites in the BBDL is a function of the transistor device transconductance ($g_m$). Thus, transistors with higher $g_m$ values yield a significant improvement in high frequency performance of the BBDL circuit. The charge transfer operation is ultimately limited by the charge transfer speed of the transistor switch. In the case of MOSFET devices, the $g_m$ value is a function of the source-drain channel aspect ratio (width/length) which cannot deliberately be made large enough for very fast charge transfer. By comparison, JFET devices have $g_m$ values five to 10 times that of comparable MOSFETs, and therefore improve the high frequency performance of the BBDL. Further, as mentioned hereinabove, the JFETs are depletion-mode devices, and therefore the lower gate voltages employed therewith reduce the severity of the clock generator requirements thereby further resulting in improved high frequency operation of the BBDL. Thus, since a BBDL fabricated of JFET devices has lower gating voltage requirements, and such devices have higher $g_m$ values, it clearly results in significantly improved high frequency performance over the MOSFET (and also the bipolar transistor) embodiments of the BBDL. And up to the time of our invention, the difficulties encountered in fabricating BBDL circuits in integrated circuit from utilizing JFETs has prevented such circuits from becoming a reality.

The fabrication of our BBDL integrated circuit will now be described, and a preferred embodiment of the JFET bucket-brigade having isolation between bucket-brigade stages formed by what is described herein as a gate diffucion isolation technique (which prevents undesired coupling of the charge packets through the epitaxial layer) will be described with specific reference to FIGS. 2*a*, *b* and *c*. The isolation is required in order to obtain high packing densities, since the JFETs are depletion-mode devices. The structures illustrated in FIGS. 2*a* and *b* show intermediate steps in forming the final structure illustrated in FIG. 2*c*, and each figure depicts only a very small portion of the bucket-brigade array, but in a very enlarged view. It must be remembered that the serially connected pairs of bucket-brigade stages may be arranged in a single rqo or in juxtaposed rows on the single integrated circuit chip. The input sampling stage 10 and output stage 12 are of very similar structure to the bucket-brigade stage and therefore are also conveniently located on the same integrated circuit chip and are fabricated as continuations of the bucket-brigade stages at the input and output ends thereof, respectively.

Referring now to FIG. 2*a*, a substrate 20 of suitable monocrystalline material and size is selected. The substrate 20 material may be an electrical insulator, such as spinel or sapphire, but is preferably a lightly doped semiconductor such as $p^-$-conductivity type silicon, the light doping resulting in lower parasitic capacitances in the fabricated JFET devices. Although our invention may be practiced using other semiconductors, such as germanium, gallium arsenide, etc., for ease of description, the invention will be described as practiced in forming silicon deivces. Also, although our invention may be practiced by utilizing an n-conductivity type semiconductor as the substrate material (and likewise using the opposite conductivity type semiconductor layers and diffused regions from that recited hereinafter as associated with the p-type substrate), again for ease of description our invention will be described with reference to the p-type substrate.

Substrate 20 may typically have a thickness of 10 mils and an area sufficient to accommodate a packing density of one square mil per bucket-brigade stage. The 10 mil thickness develops good handling characteristics for the substrate without undue waste of the material. Neither the thickness nor especially the area dimension recited hereinabove are a limitation on our invention but merely exemplary thereof. The $p^-$-type substrate has a resistivity greater than 5 ohm-centimeters (cm).

An n-doped monocrystalline thin layer 21 of silicon is next thermally grown along the entire major (top) surface of substrate 20 as depicted in FIG. 2*a*. This n-type epitaxial layer 21 has a thickness which in conjunction with the depth of the gate-diffusion 26 determines the gate voltage necessary to pinch off the n-channel of the JFET device, and is the layer into which the semiconductor junctions and isolation regions are to be diffused. The limits on the thickness of epitaxial layer 21 are therefore determined by the depth to which regions 26 are diffused. Practical values of thickness of the epitaxial layers are in the range of 1–7 microns. The n-type epitaxial layer has a resistivity typically in the range of 0.2 to 3.0 ohm-cm. As the next step in the fabrication process, a layer 24 of $SiO_2$ is thermally grown along the entire top surface of the n-type epitaxial layer 21. The $SiO_2$ layer 24 is then patterned using conventional photoresist techniques for example, and etched using hydrofluoric acid to form the gate and isolation region windows and then again for the source-drain windows (or vice-versa). As depicted in FIG. 2*a*, it will be assumed that $SiO_2$ layer 24 is first patterned and etched for simultaneous formation of the gate and isolation region windows, leaving only the portions 24*a* of the $SiO_2$ layer. The gate windows 26*a* are of equal size, generally of rectangular shape, equally spaced-apart and aligned in one row or a plurality of rows if the BBDL consists of more than onw row of bucket-brigade stages. The isolation region windows 23*a* are of rectangular shape and the two long-dimensioned sides of the windows 23*a* are slightly and equally spaced from the short-dimensioned sides of the gate windows in the case where they are rectangular as depicted in FIG. 2*a*. The spacing between gate and isolation region windows is critical since it cannot be too small as to allow the *p* diffusions 23 and 26 to merge, or so large that the isolation and gate depletion regions do not merge when the JFET devices are to be pinched off. A typical gate-to-isolation region window spacing for an epitaxial layer 21 resistivity of 1.0 ohm-cm and gate diffusion depth of 0.5 micron is in the range of 2–7 microns, and a typical gate-to-isolation region diffusion spacing for a like resistivity epitaxial layer is in the range of 0.5 to 6 microns. The isolation region windows 23*a* thus are generally parallel to each other, and the isolation depletion regions that are subsequently formed under the reverse-biased isolation diffusion regions to be described hereinafter define the two long-dimensioned sides of each row of bucket-brigade stages. The heavily-doped $p^+$ gate (26) and isolation (23) diffusions may be simultaneously done using a liquid, gaseous, or solid diffusion source such as $BBr_3$, $B_2H_6$, or $B_2O_3$ for example. The diffusion temperature will vary with the thickness and resistivity of the n-type epitaxial layer but a temperature of 950° C is an example for 3 micron thickness, 1.0 ohm-cm resistivity epitaxy.

Figure 2B:
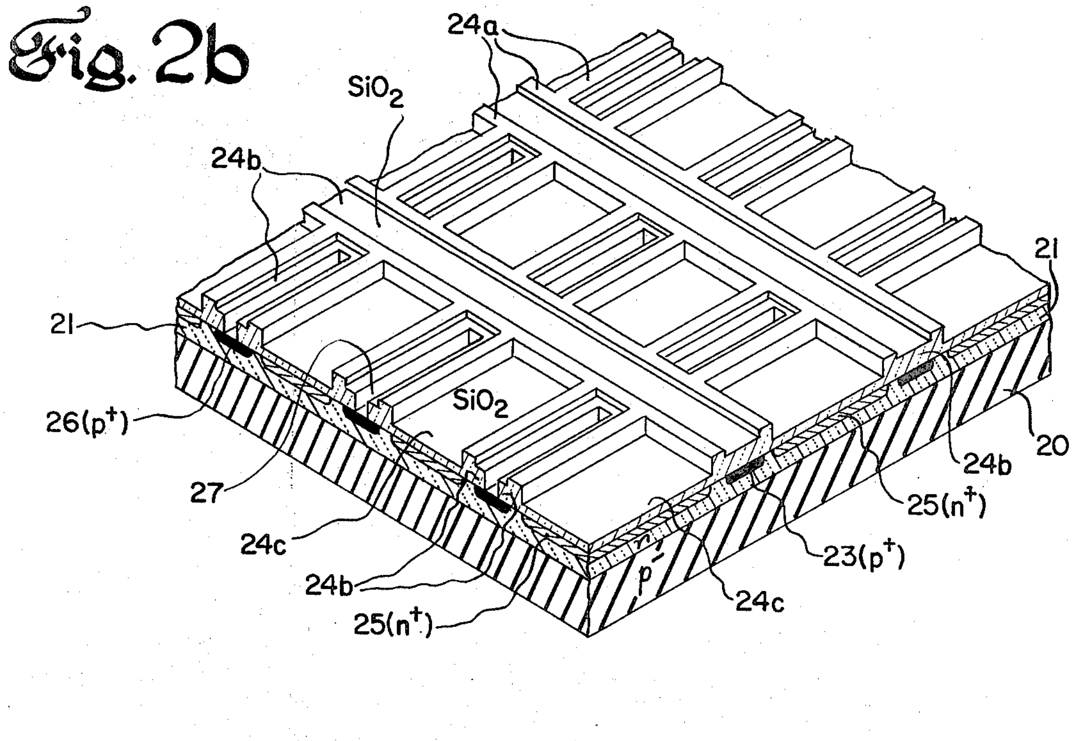

Referring now to FIG. 2*b*, immediately after the gate and isolation diffusions are completed, additional $SiO_2$ is then grown over the chip by oxidizing the silicon of epitaxial layer 21 along the gate and isolation windows in an oxygen atmosphere at 950° C for example to form $SiO_2$ layer portions 24*b*.

Following the etching of the patterned source-drain windows, the heavily doped $n^+$ source-drain regions 25 are diffused using a liquid, gaseous or solid diffusion source such as for examples $POCl_3$, $P_2O_5$ or $PH_3$ at a temperature which may be 950° C. Additional $SiO_2$ in the form of thin layer portions 24*c* is then grown over the monolithic chip by oxidizing the silicon of epitaxial layer 21 along the source-drain windows in an oxygen atmosphere at a temperature such as 950° C.

The next step involves the forming of aligned contact holes 27 through the portions 24*b* of the $SiO_2$ layer over the aligned $p^+$ gate diffused regions 26. The aligned holes 27 are of rectangular shape and are somewhat smaller than the rectangular portion of the $SiO_2$ layer 24*b* through which they are formed. The holes 27 are formed by pattern and etching similar to the steps used in forming the diffusion windows. A contact hole (not shown) is also opened at some convenient point into an isolation diffusion 23, preferably at one end of a row of the bucket-brigade stages, it being understood that all of the isolation diffusions 23 are interconnected at the ends of the rows of bucket-brigade stages.

Referring now to FIG. 2*c*, after the rectangular holes 27 are formed through the $SiO_2$ portions 24*b*, a metal layer is deposited over the entire top surface of electrically insulating $SiO_2$ layer which now includes the portions 24*b* formed over the $p^+$ gate diffused regions 26 and $p^+$ isolation diffused regions 23, the portions 24*c* formed over the $n^+$ source-drain diffused regions 25, and the remaining portions of 24*a* (from FIG. 2*a*) after the source-drain windows were formed. The remaining portions 24*a* of the $SiO_2$ layer are thicker than the 24*b* and 24*c* portions and are over the spacings between the gate and source-drain and isolation diffused regions in the epitaxial layer. The metal layer may be aluminum as one example, and fills the gate region contact holes 27 to provide direct contact with the top surface of the $p^+$ diffused gate regions 26. The metal layer is then patterned and etched to form the array of spaced-apart metal layers 28 depicted in FIG. 2*c*. The number of metal layers 28, excluding those required for the input 10 and output 12 stages is normally equal to the number of columns of bucket-brigade stages in the BBDL plus a metal layer to make contact to the isolation region 23.

At this point it should be noted that the information is propagated through adjacent rows of bucket-brigades preferably in alternate directions as shown by the arrows in order to minimize interconnections at the ends of the intermediate rows. The completed structure of the bucket-brigade states in FIG. 2*c* requires that the information be stored as charged packets in the drain-to-gate capacitors to be described hereinafter, and such charged packets be caused to propagate from left-to-right in the illustrated alternate first and third rows, and from right-to-left in the second row. Thus, the JFET devices in the first and third rows (and other alternate rows not shown) each have their source electrode being the extreme right end portion and the $n^+$ region 25 immediately to the left of each $p^+$ gate region whereas the drain electrode is all but the extreme right end portion of the $n^+$ region 25 immediately to the right of such gate region. This relative orientation of the source and drain electrodes is obviously reversed in the second row (and other alternate rows not shown) in order to obtain the reversed direction of information flow through these rows of bucket-brigade stages. In order to obtain the above-described orientation of the JFET devices, the resulting pattern of the metal layers 28 is as follows: In the first and third rows, each metal layer 28 overlaps the entire $n^+$ doped region 25 and has its left side (as seen in FIG. 2*c*) terminate beyond the contact hole 27, i.e., on the thin portion 24*b* of the $SiO_2$ layer between the adjacent thicker portion 24*a'* and contact hole 27. The right (i.e., opposite) side of each of the metal layers in the first and third rows may terminate approximately midway along the next thicker portion 24*a'* of the $SiO_2$ layer encountered after passing from left-to-right over the $n^+$ doped region 25. In the second row, the left and right sides of the metal layers 28 are displaced slightly to the right with respect to such metal layer sides in the first and third rows in order to achieve the desired above-described reversed structure of the JFETs therein. Thus, the left side of each of the metal layers 28 in the second row terminates approximately midway along the thicker portion 24*a* of the $SiO_2$ layer immediately to the right of a $p^+$ gate region 26 and the metal layer extends to the right, overlapping the entire $n^+$ doped region 25 and having its right side terminating beyond the contact hole 27, i.e., on the thin portion 24*b* of the $SiO_2$ layer between contact hole 27 and the next adjacent thicker portion 24*a* of the $SiO_2$ layer. The metal layers 28 also extend in spaced-apart relationship over the intervening $p^+$ isolation diffused regions 23 in the various columns of bucket-brigade stages. However, in order to achieve the above-described reverse orientation of the JFET devices in adjacent rows, the left and right sides of the metal layers 28 are displaced slightly to the right in their passage over isolation region 23 from the first row to the second row. In like manner, such sides are displaced slightly to the left in their passage over isolation region 23 from the second row to the third row to achieve alignment with the sides in the first row. The orientation of the various layers in the second row is shown clearly in the cut-away sectional view therein.

Although some of the fabrication steps have been described hereinabove with some detail, it is to be understood that each individual processing step is, in itself, a conventional technique and for purposes of brevity some of the fabrication details have been omitted.

Alternatively, the metal layers may be arranged without any displacements in passage over the isolation regions, in which case the $p^+$ gate diffused regions are not aligned column-by-column, and are displaced in the opposite direction from the metal layer displacements in the second row (and other alternate rows not shown).

The top surfaces of metal layers 28 generally conform to the top surface of the $SiO_2$ layer 24 and thus result in projections (or more accurately, mesas) along the isolation regions 23 as well as along the other thick layer portions 24*a* of layer 24, as shown in FIG. 2*c*. Since the same phase clock signal is applied to each JFET device in alternate columns thereof, the same first ends of first alternate metal layers 28 are extended outward to a common clock line buss which may be designated the $C_p$ line, and the opposite second ends of the second alternate metal layers 28 are extended outward (not shown) to the common clock line buss $\overline{C}_p$. The gate-to-drain storage capacitor associated with each JFET is determined by the orientation of the $n^+$ diffused region 25 relative to the overlapping portion of the metal layer 28 which is connected to the $p^+$ diffused gate region 26. The $SiO_2$ material between the two "plates" of each resultant MOS type storage capacitor serves as the dielectric material of the capacitor. Reference to FIG. 2*c* indicates that each $n^+$ diffused region is overlapped by the metal layer by a relatively large amount, and therefore a high gate-to-drain (charge packet) storage site capacitance is desirably obtained relative to the undesirable parasitic gate-source and drain-substrate capacitances.

As a typical example of the packing density, and not by way of limitation, each monolithic chip of dimension 100 × 100 mil may include 4 BBDL circuits each consisting of 500 bucket-brigade stages. Since each BBDL circuit may include several isolated rows of serially connected JFET devices and storage capacitors, the first and second ends of each row of such devices, except the first and last rows, are repsectively suitably connected to the adjacent ends of the immediately prior and subsequent row to thereby obtain the back and forth snake pattern of serially connected devices across the chip.

Finally, reference to FIG. 1 indicates the similarity of the input sampling stage 10 to a bucket-brigade stage. In view of such similarity, it is readily apparent that the input sampling stage is fabricated at the input end of the BBDL in a manner similar to a single bucket-brigade stage except that the gate electrode of sampling transistor 10*a* and capacitor 10*b* have separate metallization, the metallization of the capacitor being connected to ground.

The output source-follower stage 12*a* is an optional putput device of the voltage-sensing type. A current-sensing technique might also be used by monitoring the charge supplied by bias supply $V_{b2}$ during each precharge operation.

It is obvious by reference to the completed state of the bucket-brigade stages, as illustrated in FIG. 2*c*, that our BBDL structure consists of a common, lightly doped p-type or insulating substrate, an n-type epitaxial layer, heavily doped $n^+$ drain-source and $p^+$ gate regions diffused within the epitaxial layer and arranged in one or more rows, heavily doped $p^+$ isolation regions diffused within the epitaxial layer along the two sides of each row of drain-source and gate diffused regions and slightly spaced therefrom, and a dielectric ($SiO_2$ in our illustrated example) layer which electrically isolates spaced-apart metal layers from the $n^+$ diffused drain regions and thereby also serves as the dielectric of the bucket-brigade storage capacitors. The metal layers are of number equal to the number of columns of bucket-brigade stages (excluding the input 10 and output 12 stages and isolation region reverse-bias line) in the BBDL, and adjacent metal layers are spaced apart and the metal fills contact holes in the dielectric layer to provide connections from the clock line busses to the $p^+$ diffused gate regions and for connections to the input and output stages 10, 11 and isolation regions 23. The charge transfer channels between adjacent serially connected JFET devices in each row of bucket-brigade stages are defined (in width) by the isolation depletion regions formed in the epitaxial layer as a result of application of a reverse bias D.C. voltage to the isolation diffusion regions. Application of the clock voltages $C_p$ and $\overline{C}_p$ to the alternate gate diffusion regions results in the gate depletion and isolation depletion regions merging to thereby pinch off the JFET transistors alternately and therefore no undesired coupling can occur through the epitaxial layer. That is, the isolation depletion regions define the two side boundaries of the series coupled source-to-drain transistor channels and capacitor storage sites and thereby limit the transfer of the electric charge packets between adjacent capacitor storage sites to such defined source-to-drain channels and prevent undesired coupling of charge packets at any time (i.e., during the charge transfer intervals as well as during the temporary charge storage intervals).

It is apparent from the foregoing that our invention attains the objectives set forth in that it provides a new monolithic integrated BBDL circuit utilizing JFET bucket-brigades and the method of fabrication thereof. Since the JFET devices as used herein are depletion-mode structures, lower gating voltages (5 volts or less) are utilized than those with enhancement-mode MOS-FET or bipolar structures and thereby make our BBDL circuits compatible with $T^2L$ circuitry. The higher transconductance values obtainable with JFET structures as compared to the MOSFET results in substantially improved high frequency performance of our bucket-brigade circuits. As an example, for the same dimensioned structures, the JFET embodiment requires 0.4 nanosecond to transfer the first 50 percent of the stored charge whereas the n-channel MOSFET requires 4.0 nanoseconds. The JFET devices have drain-substrate parasitic capacitance values which are less than one third of those obtained on MOS devices. Also, the JFET devices have gate-substrate parasitic capacitance values which are approximately four times smaller than for the MOSFET device to thereby improve the clock generator (gate-driver) stage capability which determines the rate at which the devices can be switched. The gate-driver requirements are much less severe, and better high frequency operation results, if the total (parasitic) gate capacitance and, or the required gate voltage can be reduced, and both are reduced as stated hereinabove for the JFET devices. The use of our gate diffusion isolation for isolating bucket-brigade stages permits increased packing density. As an example of the operation that can be expected with our JFET BBDL, the bandwidth thereof is sufficiently wide such that a 10MHz clock signal with the gating voltage as low as 2 volts is a typical application. Thus, our JFET bucket-brigade circuit combines many of the advantages of the bipolar and MOSFET versions without their disadvantages. In particular, the high packing density, simple processing and good low-frequency performance of the MOSFET switch are obtained whereas the high-frequency performance, good stability and low-clocking-voltage requirement of the bipolar structure is also achieved.

Having described a specific embodiment of our BBDL integrated circuit, it is believed obvious that other conventional steps than those recited hereinabove may be utilized in the fabrication process to achieve the specific layers in our structure. It is, therefore, to be understood that changes may be made in the fabrication process which are within the full intended scope of the invention as defined by the following claims.

What is claimed as new and desired to be secured by letters patent of the United States is:

1. A monolithic integrated circuit of the bucket-brigade type utilizing depletion-mode field-effect transistors of the p-n junction type (JFET) and comprising a common substrate fabricated of a material selected from the group consisting of an electrically insulating material and a lightly doped semiconductor material of a first conductivity type, an epitaxial layer of a semiconductor material of a second conductivity type opposite of the first type and formed over a major surface of said substrate and in contact therewith, a plurality of spaced-apart heavily doped first semiconductor regions of the second conductivity type diffused in the epitaxial layer, said first doped regions forming the source and drain electrodes of adjacent depletion-mode type field effect tansistors coupled longitudinally in series circuit relationship through the epitaxial layer due to the first doped regions forming both the drain electrodes of individual transistors and the source electrodes of the next successively coupled transistors, a plurality of spaced-apart heavily doped second semiconductor regions of the first conductivity type diffused in the epitaxial layer between the first semiconductor diffused regions to form the gate electrode regions therein so that the transistors are of the JFET type, the gate electrode regions being isolated from said substrate and from each other, a thin dielectric layer formed over said epitaxial layer and in contact therewith and provided with holes therethrough aligned with the gate electrode regions located in the epitaxial layer between the source and drain electrodes of each transistor, a plurality of narrowly spaced-apart metal layers formed over said dielectric layer and in contact therewith and adapted for connection of successive metal layers to alternate outputs of a two-phase digital clock generator, said metal layers each having a relatively large surface area compared to the narrow spacing area between adjacent metal layers, said metal layers having first end portions in contact with the gate electrode regions through the holes provided in said dielectric layer, said metal layers overlapping the drain electrode portions of the first doped regions and separated therefrom by said dielectric layer to form therewith metal-oxide-semiconductor (MOS) capacitors connected between the drain and gate electrodes of the transistors and thereby forming in combination with the transistors a single row of a plurality of serially connected bucket-brigade stages in monolithic integrated circuit form, the capacitors providing temporary storage sites for electric charge packets representing information that is caused to propagate through the bucket-brigade circuit by charge transfer through the serially coupled source-to-drain transistor channels of the bucket-brigade stages in response to the transistors being alternately and successively rendered conducting and nonconducting as a result of the application of two-phase clock pulses from the outputs of the digital clock, and heavily doped third semiconductor regions of the first conductivity type diffused only partially through the thickness of the epitaxial layer and disposed only along two opposite sides of the series coupled source-to-drain transistor channels and capacitor storage sites and slightly spaced therefrom, said third semiconductor diffused regions adapted to be connected to a voltage source for reverse bias of said third semiconductor diffused regions resulting in formation of depletion regions in the epitaxial layer extending vertically to the substrate, the heavily doped third semiconductor diffused regions each being slightly spaced from said second semiconductor diffused regions to prevent merging thereof, the spacing not being sufficiently large to prevent lateral merging of the resultant depletion regions upon application of the clock pulse voltage to the second semiconductor diffused regions, the formation of the vertical depletion regions, extending from the third semiconductor regions to the substrate and the formation of the lateral depletion regions which merge the second semiconductor regions with the third semiconductor regions thereby defining the two side boundaries of the series coupled source-to-drain transistor channels and capacitor storage sites so as to allow the transfer of electric charge packets between adjacent capacitor storage sites to occur across the entire width of the defined source-to-drain channels and prevent any undesired coupling of the charge packets at any time and to increase the transconductance of the transistors and to increase the packing density for a given area of the substrate as compared to conventional diffusion isolation or ring structure isolation of JFET devices.

2. The monolithic integrated bucket-brigade circuit set forth in claim 1 wherein said common substrate comprises a $p^-$ conductivity type semiconductor material, said epitaxial layer comprises an n conductivity type semiconductor material, said heavily doped first semiconductor regions comprise an $n^+$ conductivity type semiconductor material, and said heavily doped second and third semiconductor regions comprise a $p^+$ conductivity type semiconductor material.

3. The monolithic integrated bucket-brigade circuit set forth in claim 1 wherein said heavily doped third semiconductor regions are oriented parallel to each other and are overlapped by said metal layers in an orientation substantially perpendicular thereto.

4. The monolithic integrated bucket-brigade circuit set forth in claim 1 wherein said epitaxial layer is a common layer in contact with the entire major surface of said substrate.

5. The monolithic integrated bucket-brigade circuit set forth in claim 1 wherein said epitaxial layer comprises an n conductivity type semiconductor material and has a resistivity in the range of 0.2 to 3.0 ohm-cm.

6. The monolithic integrated bucket-brigade circuit set forth in claim 5 wherein the spacing between said second and third semiconductor diffused regions for an epitaxial layer resistivity of 1.0 ohm-cm. is in the range of 0.5 to 6.0 microns.

7. The monolithic integrated bucket-brigade circuit set forth in claim 1 wherein the thickness of the epitaxial layer is in the range of 1 to 7 microns and is determined primarily by the depth to which said second semiconductor regions are diffused therein.

8. A monolithic integrated circuit of the bucket-brigade type utilizing depletion-mode field-effect transistors of the p-n junction type (JFET) and comprising a common substrate fabricated of a material selected from the group consisting of an electrically insulating or lightly doped semiconductor material of a first conductivity type, an epitaxial layer of a semiconductor material of a second conductivity type opposite of the first type and formed over a major surface of said substrate and in contact therewith, a plurality of spaced-apart heavily doped first semiconductor regions of the second conductivity type diffused in the epitaxial layer and arranged in juxtaposed parallel oriented rows, said first doped regions forming the source and drain electrodes of adjacent depletion-mode type field effect transistors coupled longitudinally in series circuit relationship in each row thereof through the epitaxial layer due to the first doped regions forming both the drain electrodes of individual transistors and the source electrodes of the next successively coupled transistors, a plurality of spaced-apart heavily doped second semiconductor regions of the first conductivity type diffused in the epitaxial layer between the first semiconductor diffused regions to form gate electrode regions therein so that the transistors are of the JFET type, the gate electrode regions being isolated from said substrate and from each other, a thin dielectric layer formed over said epitaxial layer and in contact therewith and provided with holes therethrough aligned with the gate electrode regions located in the epitaxial layer between the source and drain electrodes of each transistor, a plurality of narrowly spaced-apart parallel metal layers formed over said dielectric layer and in contact therewith and adapted for connection of successive metal layers to alternate outputs of a two-phase digital clock generator, said metal layers each having a relatively large surface area compared to the narrow spacing area between adjacent metal layers, said metal layers oriented substantially perpendicular to the rows of serially coupled transistors and having first end portions in contact with the gate electrode regions through the holes provided in said dielectric layer, said metal layers overlapping the drain electrode portions of the first doped regions and separated therefrom by said dielectric layer to form therewith metal-oxide-semiconductor (MOS) capacitors connected between the drain and gate electrodes of the transistors and thereby forming in combination with the transistors a plurality of rows and columns of bucket-brigade stages in monolithic integrated circuit form, the bucket-brigade stages being serially connected in each row, the capacitors providing temporary storage sites for electric charge packets representing information that is caused to propagate through the bucket-brigade circuit by charge transfer through the serially coupled source-to-drain transistor channels of the bucket-brigade stages in response to the transistors being alternately and successively rendered conducting and nonconducting as a result of the application of two-phase clock pulses from the outputs of the digital clock, and heavily doped third semiconductor regions of the first conductivity type diffused only partially through the thickness of the epitaxial layer and disposed only along two opposite sides of each of the rows of series coupled source-to-drain transistor channels and capacitor storage sites and slightly spaced therefrom, said third semiconductor diffused regions adapted to be connected to a voltage source for reverse-bias of said third semiconductor diffused regions resulting in formation of depletion regions in the epitaxial layer extending to the substrate, the heavily doped third semiconductor diffused regions each being slightly spaced from said second semiconductor diffused regions to prevent merging thereof, the spacing not being sufficiently large to prevent lateral merging of the resultant depletion regions upon application of the clock pulse voltage to the second semiconductor diffused regions, the formation of the vertical depletion regions extending from the third semiconductor regions to the substrate and the formation of the lateral depletion regions which merge the second semiconductor regions with the third semiconductor regions thereby defining the two side boundaries of each row of the series coupled source-to-drain transistor channels and capacitor storage sites so as to allow the transfer of electric charge packets between adjacent capacitor storage sites to occur across the entire width of the defined source-to-drain channels and preventing any undesired coupling of the charge packets at any time, and to increase the transconducdance of the transistors and to increase the packing density for a given area of the substrate as compared to conventional diffusion isolation or ring structure isolation of JFET devices.

9. The monolithic integrated bucket-brigade circuit set forth in claim 8 wherein said common substrate comprises a $p^-$ conductivity type semiconductor material, said epitaxial layer comprises an n conductivity type semiconductor material, said heavily doped first semiconductor regions comprise an $n^+$ conductivity type semiconductor material, and said heavily doped second and third semiconductor regions comprise a $p^+$ conductivity semiconductor material.

10. The monolithic integrated bucket-brigade circuit set forth in claim 8 wherein said heavily doped third semiconductor regions are oriented parallel to each other and are overlapped by said metal layers in an orientation substantially perpendicular thereto.

11. The monolithic integrated bucket-brigade circuit set forth in claim 8 wherein the substrate semiconductor material is silicon, the epitaxial layer material is silicon, and the dielectric layer material is silicon dioxide.

12. The monolithic integrated bucket-brigade circuit set forth in claim 11 wherein the metal layer material is aluminum.

* * * * *